United States Patent
G et al.

(10) Patent No.: US 11,942,962 B2
(45) Date of Patent: Mar. 26, 2024

(54) METHODS AND APPARATUS TO WRITE DATA TO REGISTERS

(71) Applicant: Texas Instruments Incorporated, Dallas, TX (US)

(72) Inventors: Anand Kumar G, Bangalore (IN); Srinivasa Chakravarthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 190 days.

(21) Appl. No.: 17/691,606

(22) Filed: Mar. 10, 2022

(65) Prior Publication Data
US 2023/0129042 A1    Apr. 27, 2023

(30) Foreign Application Priority Data
Sep. 28, 2021   (IN) .............................. 202141043961

(51) Int. Cl.
| | |
|---|---|
| H03M 1/12 | (2006.01) |
| H03M 1/00 | (2006.01) |
| G06F 3/06 | (2006.01) |
| G06F 13/00 | (2006.01) |
| G06F 13/28 | (2006.01) |

(52) U.S. Cl.
CPC ............... *H03M 1/12* (2013.01); *H03M 1/00* (2013.01); *G06F 3/0604* (2013.01); *G06F 3/0655* (2013.01); *G06F 3/0679* (2013.01); *G06F 13/00* (2013.01); *G06F 13/28* (2013.01); *G06F 2213/28* (2013.01)

(58) Field of Classification Search
CPC ........... H03M 1/12; H03M 1/00; G06F 13/00; G06F 3/0655; G06F 3/0604; G06F 3/0679; G06F 13/28
See application file for complete search history.

(56) References Cited

U.S. PATENT DOCUMENTS

2005/0273539 A1*  12/2005  Yamamoto .......... G06F 13/4256
                                                               710/110

* cited by examiner

*Primary Examiner* — Joseph J Lauture
(74) *Attorney, Agent, or Firm* — Mandy Barsilai Fernandez; Frank D. Cimino

(57) ABSTRACT

Methods, apparatus, systems, and articles of manufacture are disclosed. An example apparatus includes interface circuitry to receive an analog signal. The example apparatus also includes sequencer circuitry to: determine whether the apparatus is to operate in a single transfer state or a multiple transfer state; access a configuration from a control register in a plurality of control registers; initiate a conversion of the analog signal to a digital value based on the configuration; and write the digital value to a result register in a plurality of result registers based on the determination.

20 Claims, 11 Drawing Sheets

METHODS AND APPARATUS TO WRITE DATA TO REGISTERS

FIELD OF THE DISCLOSURE

This disclosure relates generally to memory registers and, more particularly, to methods and apparatus to write data to registers.

BACKGROUND

Data that is transmitted to a computing device may be received as an analog signal, where physical parameters such as a voltage or current encode information. To obtain the encoded information, Analog to Digital Converter (ADC) circuitry samples the analog signal and converts the signal to a digital value based on the physical parameters. In some use cases, such as sensing and control applications, the required rate of conversion from analog to digital values is relatively low (i.e., in the magnitude of thousands of conversions per second). In other use cases, such as signal processing applications, the required rate of conversion is relatively high (i.e., in the magnitude of millions of conversions per second).

SUMMARY

Example methods, apparatus, systems, and articles of manufacture are disclosed. An example apparatus includes interface circuitry to receive an analog signal. The example apparatus also includes sequencer circuitry to: determine whether the apparatus is to operate in a single transfer state or a multiple transfer state; access a configuration from a control register in a plurality of control registers; initiate a conversion of the analog signal to a digital value based on the configuration; and write the digital value to a result register in a plurality of result registers based on the determination.

BRIEF DESCRIPTION OF THE DRAWINGS

In general, the same reference numbers will be used throughout the drawing(s) and accompanying written description to refer to the same or like parts. The figures are not to scale.

Figure 1:
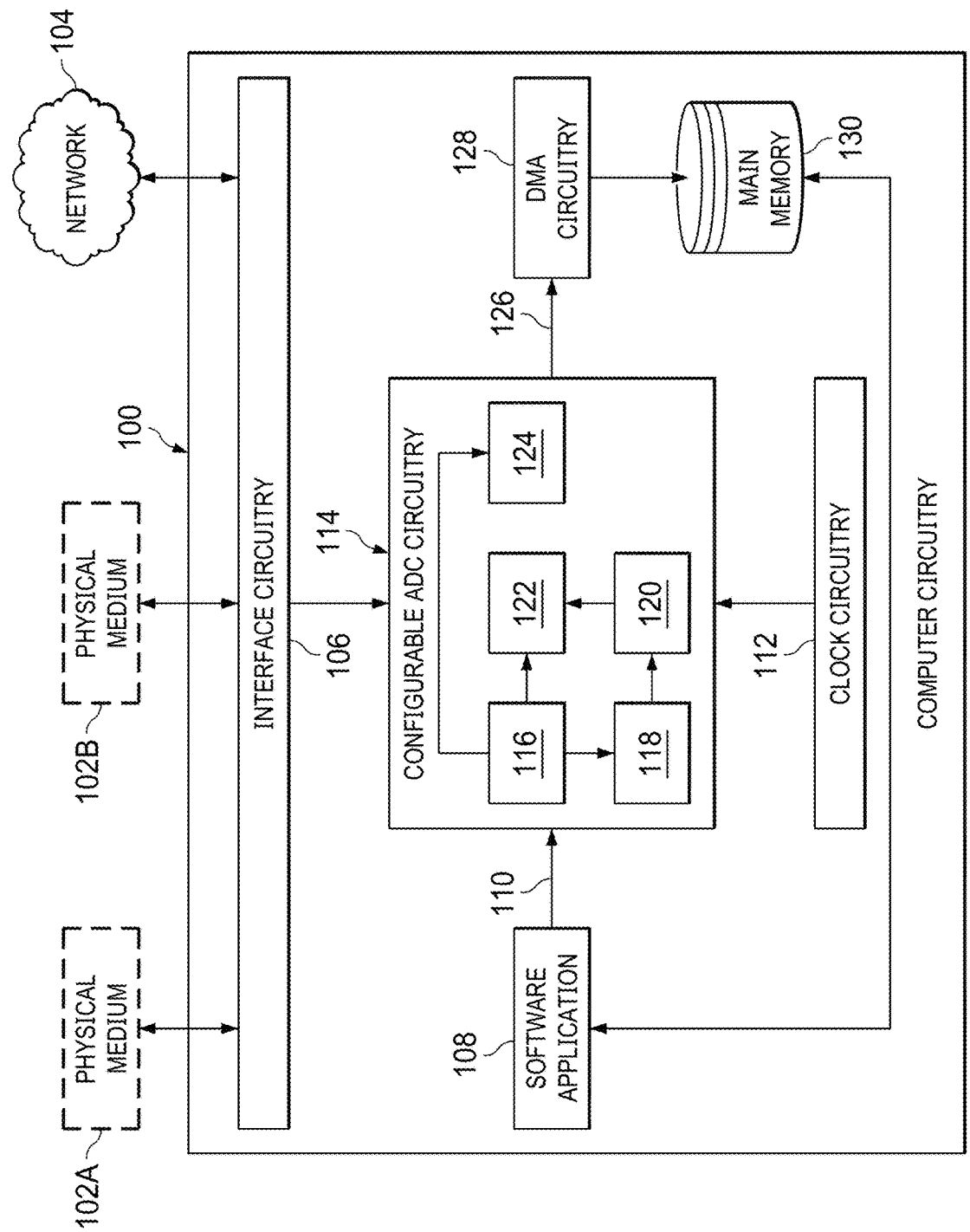
FIG. 1 is a block diagram of an example implementation of computer circuitry.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

In many examples, Analog to Digital (A/D) conversion is performed by dedicated ADC circuitry. The implementation and functionality of an ADC circuit may depend on the surrounding compute resources and how the converted digital values are used. For example, if the ADC circuitry is implemented within a microcontroller, it may support applications that include but are not limited to (a) sensing and control, and (b) signal processing.

As used herein, sensing and control applications refer to any application that gathers data about a device or environment and performs actions to control the device or environment. Sensing and control applications include but are not limited to Internet of Things enabled devices, automotive control systems such as automated emergency breaking, lane keeping or gear shifting, flight control systems such as drone stabilization, robotic pose estimation, etc.

Due to their relatively low frequency of A/D conversion requests, many sensing and control applications may access the conversion results as soon as the conversion occurs to determine a control action. In some examples, a single ADC circuit may be used by different application threads, where each thread uses a different ADC channels and expects the converted ADC result in a separate register. In such examples, an ADC circuit may have a set of registers with a one to one correspondence between a specific thread and a register. As used herein, a register refers to a specific address in memory that an ADC circuit can access and store conversion results in. Sensing and control applications are explored further in FIG. 2.

Some ADC circuits may support signal processing applications. As used herein, signal processing applications refer to any application that analyzes, modifies, or synthesizes signals. Examples of signal processing applications may be found in audio processing, image processing, video processing, wireless communications, etc. Due to their relatively high frequency of A/D conversion requests, signal processing applications may wait to access multiple conversion results at once to reduce the amount of resources used to access results. Signal processing applications are explored further in FIG. 3.

Previous implementations of ADC circuitry fail to provide a single set of registers that can both provide conversion results as soon as they are generated (as requested by control and sensing applications) and buffer high frequency conversion results (as requested by signal processing applications). Furthermore, the addition of a second set of registers to a previous ADC circuitry implementation, such as (a) the addition of buffer registers to an ADC circuit configured for sensing and control applications or (b) the addition of registers that immediately transfer results to an ADC circuit configured for signal processing applications, would increase the memory required to implement the ADC circuitry and be computationally expensive.

Example systems, methods, and apparatus disclosed herein implement a single set of registers to store ADC results that can both provide conversion results as soon as they are generated for some threads and buffer high frequency conversion results for others. Example configurable ADC circuitry includes sequencer circuitry to receive a conversion mode and a First In First Out (FIFO) mode from a software application. The sequencer circuitry accesses a configuration from a memory control register based on a read pointer and updates the read pointer based on the conversion mode. A/D conversion circuitry determines digital values based on the configuration and stores the values into result registers based on a write pointer. The sequencer circuitry updates the write pointer based on the FIFO mode. In doing so, the configurable ADC circuitry supports single channel sensing and control, multi-channel sensing and control, single channel signal processing, and multi-channel signal processing modes of operation.

FIG. 1 is a block diagram of an example implementation of computer circuitry. FIG. 1 includes example computer circuitry 100, physical mediums 102A-102B, and a network 104. The example computer circuitry 100 includes example interface circuitry 106, an example software application 108, software triggers 110, example clock circuitry 112, example configurable ADC circuitry 114, interrupts 126, example Direct Memory Access (DMA) circuitry 128, and example main memory 130. The example configurable ADC circuitry 114 includes but is not limited to example sequencer circuitry 116, example sample and hold circuitry 118, example A/D conversion circuitry 120, result registers 122, and example interrupt circuitry 124.

The interface circuitry 106 of FIG. 1 receives analog signals from one or more external sources. A first external source may provide the analog signals corresponding to sensing and control applications over a wired connection via the physical medium 102A. In other examples, a second external source may provide the analog signals corresponding to signal processing applications over a wired connection via the physical medium 102B. In other examples, a third external source may provide analog signals corresponding to either type of software application over a wireless connection via the network 104. The analog signals may contain any type of information and come from any external source.

The example software application 108 of FIG. 1 requests digital values that represent the information encoded in the analog signals received at the interface circuitry 106. The requests for digital values may be referred to as software triggers 110. The example software application 108 may include a sensing and control application and/or a signal processing application.

The example clock circuitry 112 of FIG. 1 generates periodic pulses at a specific time interval. The periodic pulses, which may be referred to as a clock signal, are used to help determine when to sample an analog signal.

The example configurable ADC circuitry 114 of FIG. 1 receives the analog signals from the interface circuitry 106 and the software triggers 110. Upon receiving a software trigger 110A, the example sequencer circuitry 116 instructs the sample and hold circuitry 118 to sample the analog signal using a set of conversion parameters. In some examples, the set of conversion parameters may be referred to as a conversion configuration.

The example A/D conversion circuitry 120 converts the sampled analog voltage to a digital value using the clock signal and the conversion configuration. Based on input from the example software application 108, the example sequencer circuitry 116 stores the digital value in one of the result registers 122.

The example sequencer circuitry 116 determines whether one or more digital values should be moved from the result registers 122. If the example sequencer circuitry 116 determines one or more digital values should be moved, the interrupt circuitry 124 generates interrupts 126. As used herein, an interrupt refers to a request for processor circuitry to interrupt currently executing code and process the stored digital value in a timely manner. The example interrupt circuitry 124 provides the interrupts 126 to the DMA circuitry 128.

The example configurable ADC circuitry 114 supports A/D conversion in the following states: (a) single channel sensing and control, (b) multi-channel sensing and control, (c) single channel signal processing, or (d) multi-channel signal processing. The example configurable ADC circuitry 114 may include additional functionality not illustrated in FIG. 1 for simplicity. The example configurable ADC circuitry 114 is explored further in FIG. 4.

The example DMA circuitry 128 of FIG. 1 responds to interrupts 126 by initiating transfers of A/D conversion results from the example configurable ADC circuitry 114 to main memory 130. The example DMA circuitry 128 performs the transfer on a communication bus that may be utilized by other hardware functionality not illustrated in FIG. 1. In some examples, the example DMA circuitry 128 may be referred to as a DMA controller.

The main memory 130 stores the A/D conversion results and provides the results to the example software application 108. The main memory 130 may be implemented by any type of RAM, including but not limited to Synchronous Dynamic Random Access Memory (SDRAM), Dynamic Random Access Memory (DRAM), RAMBUS® Dynamic Random Access Memory (RDRAM®), and/or any other type of RAM device.

The example computer circuitry 100 of FIG. 1 implements an example software application 108 that accesses information from analog signals using the example configurable ADC circuitry 114. The example configurable ADC circuitry 114 supports both sensing and control applications and signal processing applications when previous solutions fail to do so.

Figure 2:
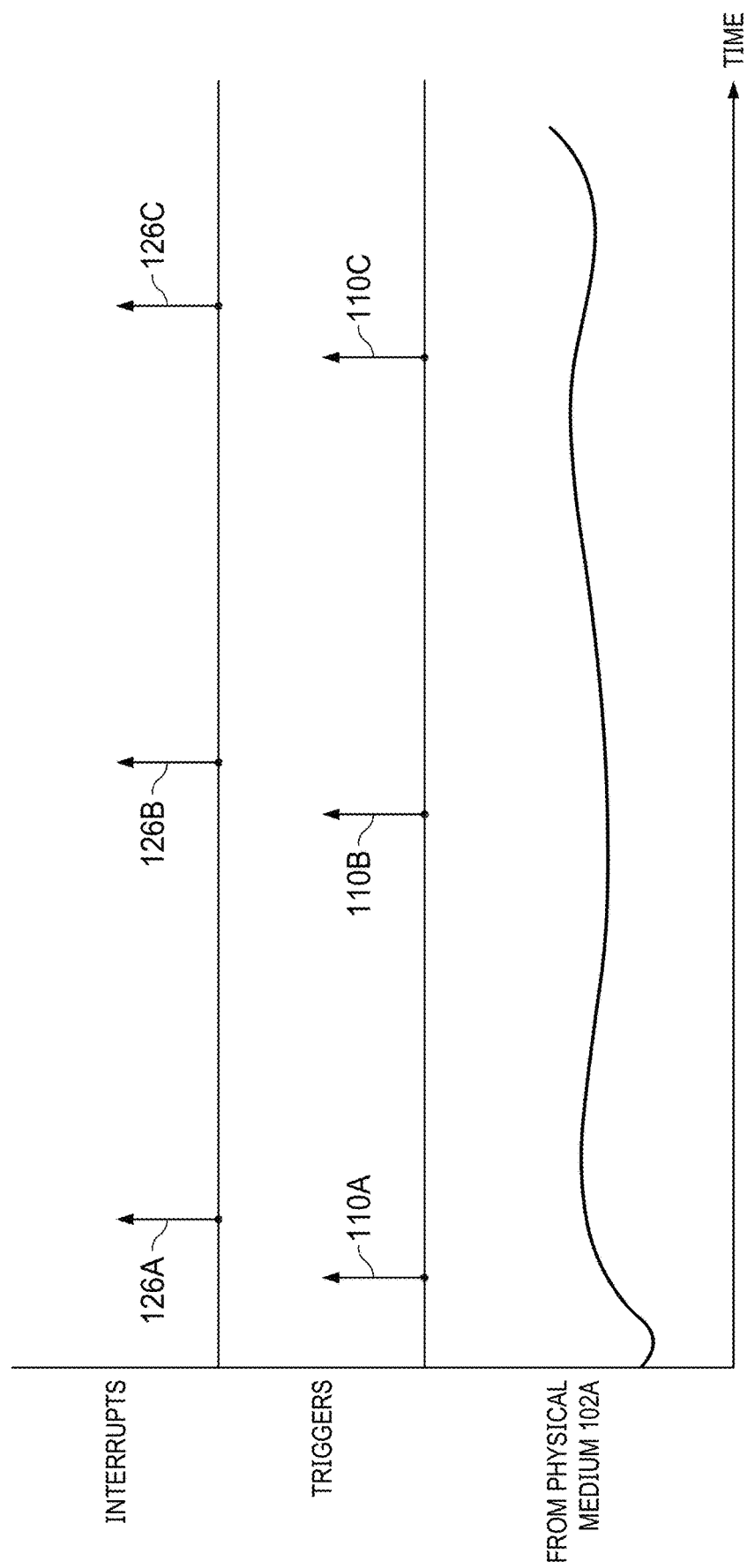
FIG. 2 is an example timing diagram for sensing and control applications.

FIG. 2 is an example timing diagram for sensing and control applications. FIG. 2 includes an analog signal from the physical medium 102A, software triggers 110A-110C, and interrupts 126A-126C. The illustrative example of FIG. 2 may be implemented by a compute device that includes at least the example configurable ADC circuitry 114, processor circuitry, and main memory.

The analog signal from the physical medium 102A is any signal that contains data used by a sensing and control application. For example, the example analog signal of FIG. 2 may describe the ambient temperature of a room over an amount of time.

The software triggers 110A-110C of FIG. 2 represent instances when a sensing and control application requests a digital value from the analog signal. The sensing and control application may request a digital value to gather data about a device or environment.

When the example configurable ADC circuitry 114 receives a software trigger 110A, the A/D conversion circuitry 120 produces a digital value that is stored in one of the result registers 122. Once the value is stored, the example interrupt circuitry 124 generates an interrupt 126A. This interrupt causes the example DMA circuitry 128 to transfer the digital value to main memory 130.

The example DMA circuitry 128 may transfer data from a variety of hardware components. In some examples, all DMA transfers throughout a compute device may share a single communication bus. The illustrative example of FIG. 2 shows that an ADC circuit may generate an interrupt 126A-126C each time a software trigger 110 is received. This is achievable because sensing and control applications send software triggers 110 to the example configurable ADC circuitry 114 at relatively low frequencies (i.e., in the magnitude of thousands of conversions per second). As a result, a compute device may determine that an amount of DMA bus utilization attributable to a sensing and control application does not prohibit further bus utilization from other resources.

Figure 3:
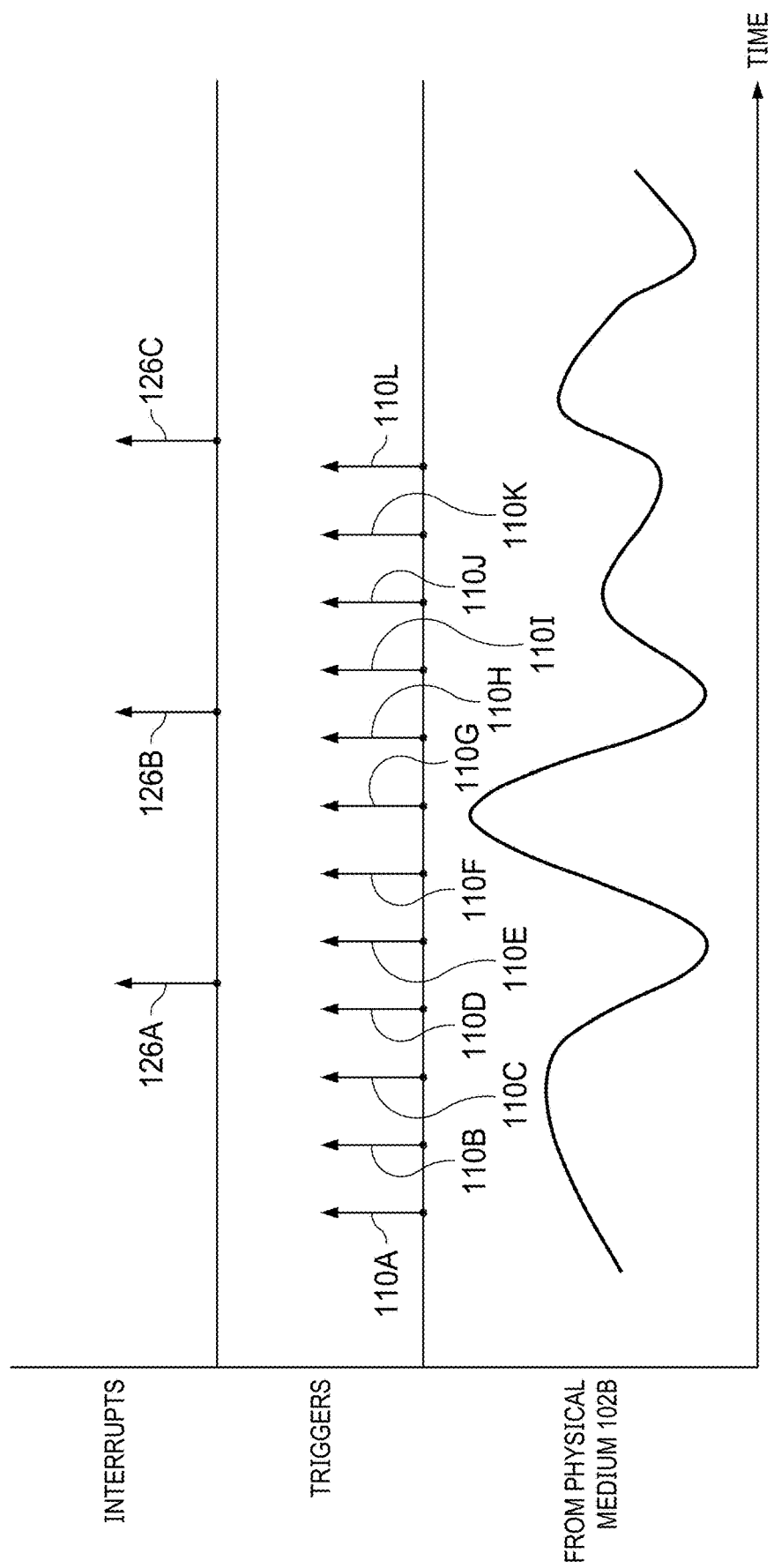
FIG. 3 is an example timing diagram for signal processing applications.

FIG. 3 is an example timing diagram for signal processing applications. FIG. 3 includes an analog signal from the physical medium 102B, software triggers 110A-110L, and interrupts 126A-126C. The illustrative example of FIG. 3 may be implemented by a compute device that includes at least the example configurable ADC circuitry 114, processor circuitry, and main memory.

The analog signal from the physical medium 102B is any signal that contains data used by a signal processing application. For example, the example analog signal of FIG. 3 may represent audio data of a person speaking.

To access the information in the signal 302, the signal processing application sends software triggers 110A-110L to the example configurable ADC circuitry 114. As a result, the A/D conversion circuitry 120 performs an A/D conversion for each of the software triggers 110-110L. In contrast to sensing and control applications, signal processing applications requires A/D conversions at a relatively high frequency (i.e., millions of conversions per second).

If an ADC circuit were to generate an interrupt and trigger a DMA transfer after each A/D conversion for a signal processing application, a compute device may determine that an amount of DMA bus utilization attributable to the sensing and control application prohibits further bus utilization from other resources. To prevent this, the example configurable ADC circuitry 114 stores multiple results in the result registers 122. The example interrupt circuitry 124 may then generate an interrupt 126A after the example sequencer circuitry 116 determines a threshold number of digital values are stored in the result registers 122. When an interrupt 126A is generated, the DMA circuitry 128 may move any A/D conversion results currently in the result registers 122 to main memory. The results may be stored in and taken from the result registers 122 using a FIFO technique.

The use of a FIFO technique to store and access multiple A/D conversion results in FIG. 3 ensures the number of interrupts 126A-126C is smaller than the number of software triggers 110A-110L sent by a signal processing application. In doing so, the example configurable ADC circuitry 114 is able to generate A/D conversion results at a high frequency as required by a signal processing application while also minimizing the DMA bus utilization attributable to the sensing and control application.

Figure 4:
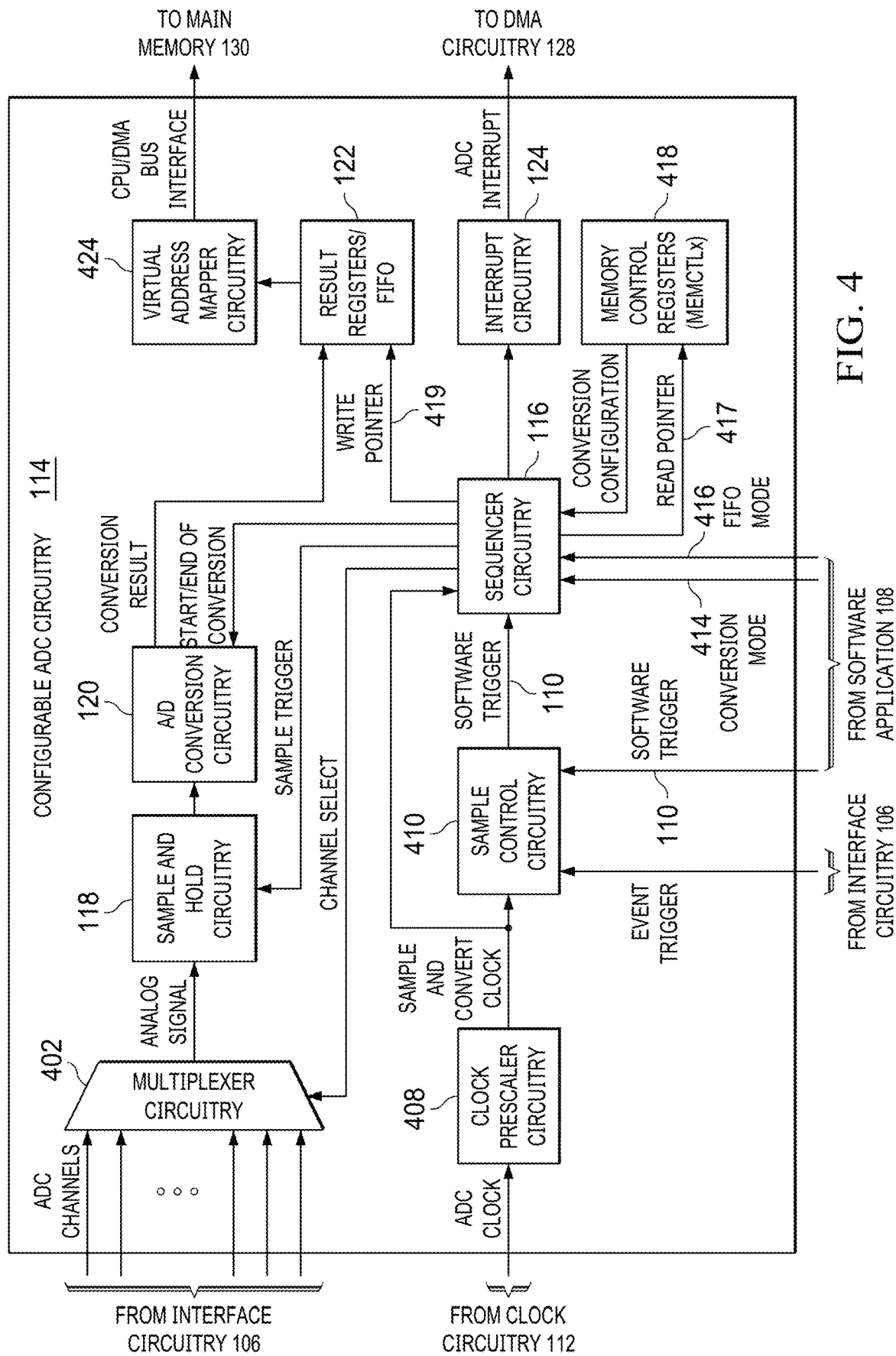
FIG. 4 is a block diagram of an example implementation of configurable ADC circuitry.

FIG. 4 is a block diagram of example configurable ADC circuitry 114 to convert analog signals into digital values. FIG. 4 includes example multiplexer circuitry 402, example sample and hold circuitry 118, example A/D conversion circuitry 120, example clock pre-scaler circuitry 408, example sample control circuitry 410, example software trigger 110A, example sequencer circuitry 116, an example conversion mode 414, an example FIFO mode 416, an example read pointer 417, example memory control registers 418, an example write pointer 419 example result registers 122, example virtual address mapper circuitry 424, and example interrupt circuitry 124.

The example multiplexer circuitry 402 of FIG. 4 receives analog signals from the interface circuitry 106. The example multiplexer circuitry 402 provides at least one of the analog signals to the sample and hold circuitry 118 based on a channel select signal.

The example sample and hold circuitry 118 of FIG. 4 samples the analog signal and holds the sampled voltage for a pre-determined time interval. The sample and hold circuitry 118 provides the sampled voltage to A/D conversion circuitry 120. The sample and hold circuitry 118 samples the analog circuitry based on a sample configuration and a software trigger.

The example A/D conversion circuitry 120 of FIG. 4 receives the sampled analog voltage from the sample and hold circuitry 118 and converts it into a digital bit. The example A/D conversion circuitry 120 may group n conversion results together to produce a n-bit digital value, where n is an integer.

The clock pre-scaler circuitry 408 receives a signal of periodic signals from the clock circuitry 112 and scales the pulses. To scale the received signal, the clock pre-scaler circuitry 408 may divide the frequency of the received signal into a pre-determined number of scaled pulse signals. The clock pre-scaler circuitry 408 provides the scaled pulses to the sample control circuitry 410. For example, the clock pre-scaler circuitry 408 may receive a signal at 40 Mega Hertz (MHz) from the clock circuitry 112 and divide the signal by 4. In such an example, the clock pre-scaler circuitry provides a 10 MHz scaled pulse signal to the sample control circuitry 410.

The sample control circuitry 410 receives the scaled pulse signal from the clock pre-scaler circuitry 408. The sample control circuitry 410 may receive a software trigger 110A from the example software application 108. In response to receiving the software trigger 110A, the sample control circuitry 410 provides the software trigger 110A to the sequencer circuitry 116 based on timing from the scaled pulse signal.

In other examples, the sample control circuitry 410 may receive an event trigger from the interface circuitry 106, where an event trigger is a request to perform an A/D conversion in response to an event caused by an external device. Events caused by external devices include but are not limited to keystrokes, mouse movement, etc.

The example sequencer circuitry 116 of FIG. 4 receives the software trigger 110A from the sample control circuitry 410 and the scaled pulse signal from the clock pre-scaler circuitry 408. The example sequencer circuitry 116 also receives a conversion mode 414 and a FIFO mode 416 from the example software application 108. The conversion mode 414 may be in a repeat single channel state or a repeat multiple channel state. The FIFO mode 416 may be in a signal processing state or a sensing and control state. In some examples, the signal processing state may be referred to as a single transfer state. Similarly, in some examples, the sensing and control state may be referred to as a multiple transfer state. The example configurable ADC circuitry 114 may operate in either the signal processing state or the sensing and control state. The conversion mode 414 and FIFO mode 416 are explored further in FIGS. 5-11.

The example sequencer circuitry 116 uses the conversion mode 414 and a read pointer 417 to access a conversion configuration from a register in the memory control registers 418. As used herein, a conversion configuration refers to a set of parameters that describe how an A/D conversion should be performed. Example parameters within a conversion configuration include but are not limited to which of the analog signals to select, threshold voltage values to compare against the analog sample voltage, sample period, etc.

The example sequencer circuitry 116 initiates an A/D conversion based on the conversion configuration. For example, the A/D conversion circuitry 120 provides a channel select signal to the multiplexer circuitry 402, a software trigger to the sample and hold circuitry 118, a start conversion signal to the A/D conversion circuitry 120, and an end conversion signal to the A/D conversion circuitry 120.

The example result registers 122 of FIG. 4 stores the n-bit digital values that are generated by the A/D conversion circuitry 120. The example sequencer circuitry 116 determines which of the result registers 122 should hold a given n-bit digital value based on the FIFO mode 416 and a write pointer 419.

The virtual address mapper circuitry 424 assigns virtual address to the result registers 122. The DMA circuitry 128 then uses the virtual address to identify the result registers 122 and transfers results to main memory 130. In some example implementations, the DMA circuitry 128 is unable to support wrap-around addressing. In wrap-around addressing, the DMA circuitry 128 accesses a group of results that wrap around a section of memory. For example, suppose ten virtual addresses are numbered 0-9 for simplicity. A DMA circuitry 128 in wrap around mode may access five values from the example virtual addresses, where the first three values are stored in virtual addresses 7, 8, 9, and the last two values are stored in virtual addresses 0 and 1. Wrap-around addressing techniques may be used when the FIFO mode 416 is in the signal processing state.

To support DMA circuitry 128 that does not implement wrap around addressing, the virtual address mapper circuitry 424 maps each of the result registers 122 to a single virtual address when the FIFO mode 416 is in the signal processing state. As a result, all DMA circuitry 128 implementations, regardless of wrap-around addressing support, may refer to the single virtual address to access any of the result registers 122. When the FIFO mode 416 is in the sensing and control state, the virtual address mapper circuitry 424 may map the result registers 122 to multiple virtual addresses.

The example interrupt circuitry 124 of FIG. 4 generates interrupts based on a received signal from the sequencer circuitry 116. In some examples, the interrupt circuitry 124 generates an interrupt that causes the DMA circuitry 128 to move data from the result registers 122 into main memory 130. In other examples, the interrupt circuitry 124 may generate an interrupt for other purposes such as reporting a status to processor circuitry.

The example configurable ADC circuitry 114 includes sequencer circuitry 116 that determines when the example software application 108 wants an A/D conversion, what conversion configuration should be used to perform the A/D conversion, and where the resulting digital value should be stored. In doing so, the result registers 122 can be configured such that each new digital value triggers a DMA transfer, as used when the example software application 108 is categorized as sensing and control. Alternatively, the result registers 122 can configured to store results in a FIFO technique such that a single DMA transfer moves multiple digital values to main memory 130, as used when the example software application 108 is categorized as signal processing. The example sequencer circuitry 116 is explored further in FIGS. 5-11.

Figure 5:
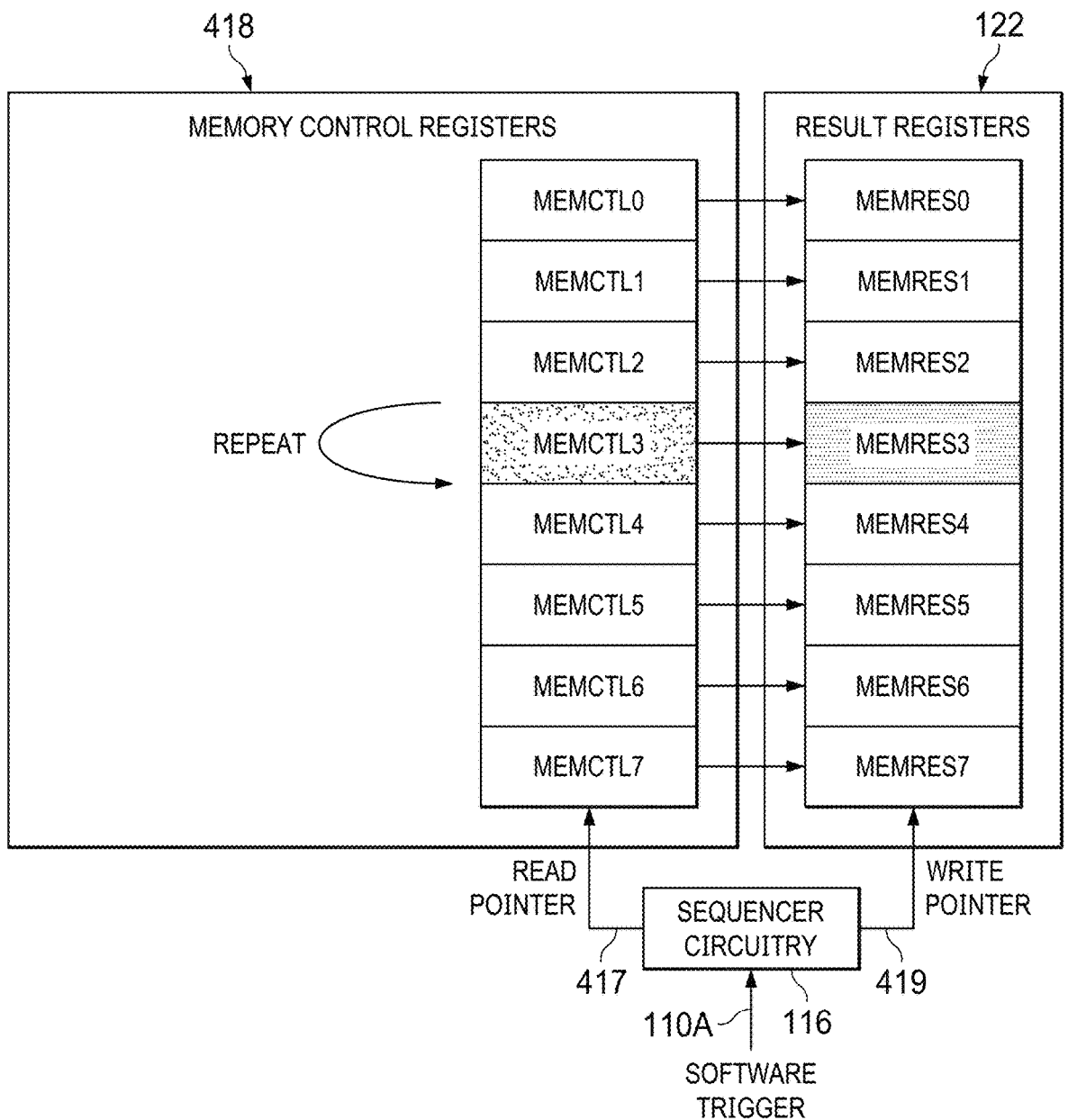
FIG. 5 is an illustrative example of a repeat single channel conversion state and a sensing and control state.

FIG. 5 is an illustrative example of a repeat single channel conversion state and a sensing and control state. FIG. 5 includes the software trigger 110A, sequencer circuitry 116, read pointer 417, write pointer 419, memory control registers 418, and result registers 122.

The example software trigger 110A of FIG. 5 indicates that an A/D conversion has been requested. In FIG. 5, the software trigger 110A is provided by the example software application 108.

The example read pointer 417 points to one of the memory control registers 418. When a software trigger 110A is received, the example sequencer circuitry 116 initiates an A/D conversion based on the conversion configuration stored in the register identified by the current value of the read pointer 417. In the illustrative example of FIG. 5, the read pointer 417 identifies Memory Control register 3 (MEMCTL3).

The conversion mode 414 indicates how the read pointer 417 should be updated after the example sequencer circuitry 116 initiates the A/D conversion. In the illustrative example of FIG. 5, the conversion mode 414 is in the repeat single channel state. This means that the read pointer 417 should remain pointing at MEMCTL3, which holds the conversion configuration for both the current and the next A/D conversion.

In some examples, the conversion mode 414 also indicates how many A/D conversions should be performed in response to a single software trigger. In some examples, a single A/D conversion occurs for a single software trigger. In other examples, the conversion mode 414 indicates a different value of A/D conversions should occur for a single software trigger 110A. In such examples, if the conversion mode 414 is in the repeat single channel state as illustrated in FIG. 5, each of the x A/D conversions occur using the conversion configuration stored in MEMCTL3, where x is the different value.

The example write pointer 419 points to one of the result registers 122. After an A/D conversion occurs, the sequencer circuitry 116 stores the results at the current value of the write pointer 419.

The FIFO mode 416 provided by the example software application 108 indicates how the write pointer 419 should be updated after an A/D conversion. In the illustrative example of FIG. 5, the FIFO mode 416 is in the sensing and control state. In the sensing and control state, the index of the write pointer 419 matches the index of the read pointer 417. As used herein, an index of a pointer (i.e., the read pointer 417 or write pointer 419) refers to a numerical value that represents which register the pointer currently identifies. Therefore, in FIG. 5, the write pointer 419 remains at MEMRES3 after one or more A/D conversions because the read pointer 417 remains at MEMCTL3 after the one or more A/D conversions.

The use of the sensing and control state as illustrated in FIG. 5 results in more than one A/D conversion results being stored in the same register. As a result, the example sequencer circuitry 116 may cause the interrupt circuitry 124 to generate an interrupt as soon as first results as from a first A/D conversion are stored in one of the result registers 122. In response to the interrupt, the DMA circuitry 128 may move the first results into main memory 130. This immediate transfer of digital values prevents the first results from being overwritten by second results from a second A/D conversion that are stored in the same register. As a result, the non-FIO state may be beneficial for an example software application 108 that expects A/D conversion results as soon as they are generated and requests a relatively low number of A/D conversions, such as sensing and control applications.

Figure 6:
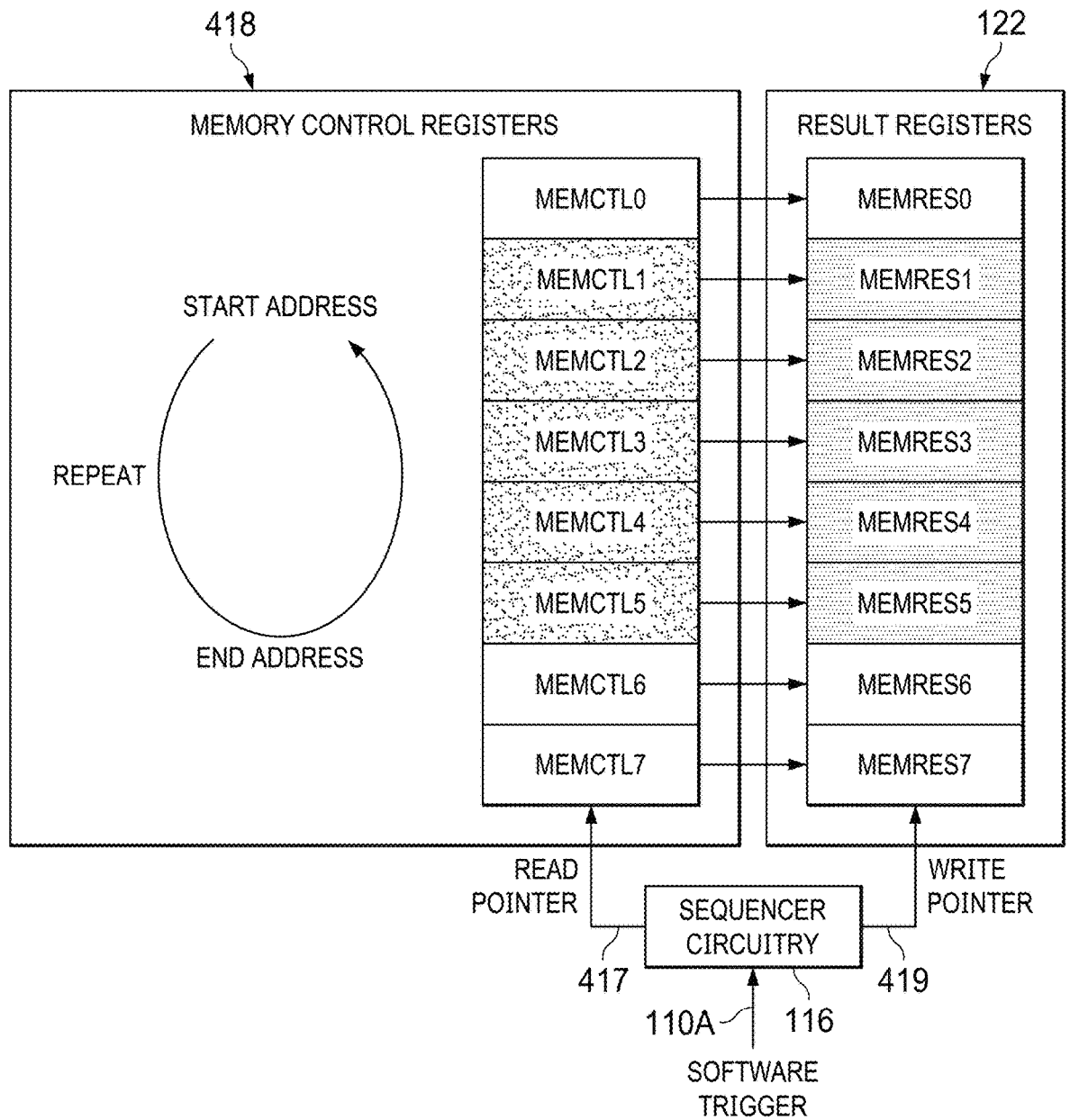
FIG. 6 is an illustrative example of a repeat multiple channels conversion state and a sensing and control state.

FIG. 6 is an illustrative of a repeat multiple channels conversion state and a sensing and control state. FIG. 6 includes a software trigger 110A, sequencer circuitry 116, read pointer 417, write pointer 419, memory control registers 418, and result registers 122.

Like FIG. 5, the example software trigger 110A of FIG. 6 indicates that an A/D conversion has been requested. In FIG. 6, the software trigger 110A is provided by the example software application 108.

The example read pointer 417 points to one of the memory control registers 418. When a software trigger 110A is received, the example sequencer circuitry 116 initiates an A/D conversion based on the conversion configuration stored in the register identified by the current value of the read pointer 417. In the illustrative example of FIG. 6, the read pointer 417 begins at MEMCTL1.

In the illustrative example of FIG. 6, the conversion mode 414 is in the repeat multiple channel state. In the repeat multiple channel state, the example software application 108 provides a start address and end address. The example sequencer circuitry 116 uses the conversion configuration from the start address (i.e., MEMCTL1 in FIG. 6) for a first A/D conversion and then updates the read pointer 417 to the next register in the memory control registers 418 (i.e., MEMCTL2). Upon receiving a request for a second A/D conversion, the example sequencer circuitry 116 uses the conversion configuration from the current read pointer 417 index (i.e., MEMCTL2) and then updates the read pointer 417 to the next register (i.e., MEMCTL3). This conversion and update process repeats until the read pointer 417 identifies the end address (i.e., MEMCTL5 in FIG. 5). After an A/D conversion that uses the conversion configuration indicated by the end address, the read pointer 417 is updated to the start address rather than the next register. The start address and end address may indicate any registers in the result registers 122 provided the end address comes after the start address numerically.

Like FIG. 5, the FIFO mode 416 of FIG. 6 is in the sensing and control state. As a result, after storing an A/D conversion result in a register in the result registers 122 as indicated by the current write pointer 419 value, the sequencer circuitry 116 updates the write pointer 419 index to match the read pointer 417 index. Therefore, conversion results using the configuration in MEMCTL1 are stored in MEMRES1, conversion results using the configuration MEMCTL2 are stored in MEMRES2, etc.

FIG. 5 and FIG. 6 illustrate two different ADC configurations that may be utilized by sensing and control applications. The use of the sensing and control state allows the example software application 108 to request A/D conversion results from either one or multiple conversion configurations and to receive the results as soon as they are generated.

Figure 7:
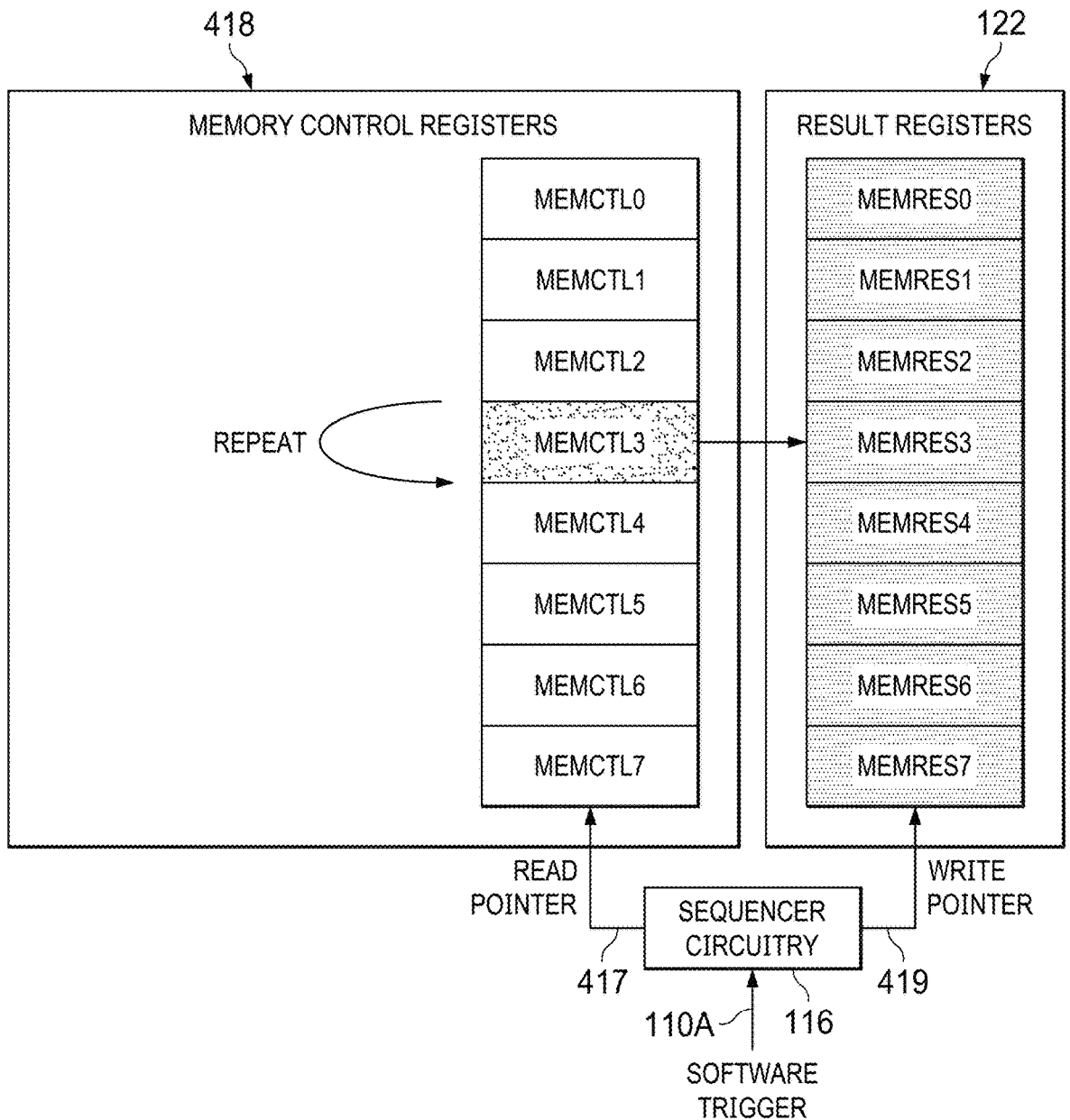
FIG. 7 is an illustrative example of a repeat single channel conversion state and a signal processing state.

FIG. 7 is an illustrative example of a repeat single channel conversion state and a signal processing state. FIG. 7 includes a software trigger 110A, sequencer circuitry 116, read pointer 417, write pointer 419, memory control registers 418, and result registers 122.

The example software trigger 110A of FIG. 7 indicates that an A/D conversion has been requested. In FIG. 7, the software trigger 110A is provided by the example software application 108.

The example read pointer 417 points to one of the memory control registers 418. As illustrated in FIG. 5, a conversion mode 414 in the repeat single channel state means that the example sequencer circuitry 116 may trigger one or more A/D conversions using the same conversion configuration (i.e., MEMCTL3 in FIG. 7) without updating the read pointer 417.

The FIFO mode 416 provided by the example software application 108 indicates how the example sequencer circuitry 116 should update the write pointer 419 after an A/D conversion. In the illustrative example of FIG. 7, the FIFO mode 416 is in the signal processing state. In the signal processing state, the write pointer 419 is not required to match the read pointer 417 index. Rather, the result registers 122 are ordered from a first result register to a last result register. As described by FIFO technique, the write pointer 419 is updated to identify a next result register where a new result should be stored based on the order of the result registers and a current result register where the previous result is stored. For example, in FIG. 7, the write pointer 419 may initially point to the first result register, MEMRES0. In such an example, a first A/D conversion using MEMCTL3 may produce a first digital value that is stored in MEMRES0, and the write pointer 419 would be updated to identify MEMRES1. A second A/D conversion using MEMCTL3 would produce results stored in MEMRES1, the write pointer 419 would be updated to identify MEMRES2, etc. This process repeats until the write pointer 419 reaches the last result register MEMRES7 and wraps back to the first result register MEMRES0.

In the signal processing state, the sequencer circuitry 116 causes the interrupt circuitry 124 to generate interrupts such that the DMA circuitry 128 transfers digital values from the result registers 122 in a group according to the order in which they were stored. The example sequencer circuitry 116 may determine the number of digital values in a group based on a pre-determined threshold value provided by the example software application 108. For example, suppose the pre-determined threshold in the illustrative example of FIG. 7 is four registers, and the write pointer 419 beings at MEMRES0. The sequencer circuitry 116 would therefore generate an interrupt to cause a single DMA transfer once MEMRES0-MEMRES3 all contain A/D conversion results. After the fourth conversion result is stored in MEMRES3, the sequencer circuitry 116 updates the write pointer 419 to identify MEMRES4. This allows additional A/D conversion results to be stored in a second subset of result registers 122 (e.g., MEMRES4-MEMRES7) while a first DMA transfer moves the conversion results from a first subset of results registers 122 (e.g., MEMRES0-MEMRES3) into main memory 130. Following the first DMA transfer, the example sequencer circuitry 116 would trigger a second DMA transfer after the next four conversion results are stored in MEMRES4-MEMRES7.

The pre-determined threshold value of the signal processing state may be based on how the use of DMA transfers by the example configurable ADC circuitry 114 affects an overall bus utilization of a computing device. In the foregoing example, the pre-determined threshold referred to four out of eight total result registers 122. In some examples, the pre-determined threshold value may refer to a different portion of result registers 122.

Figure 8:
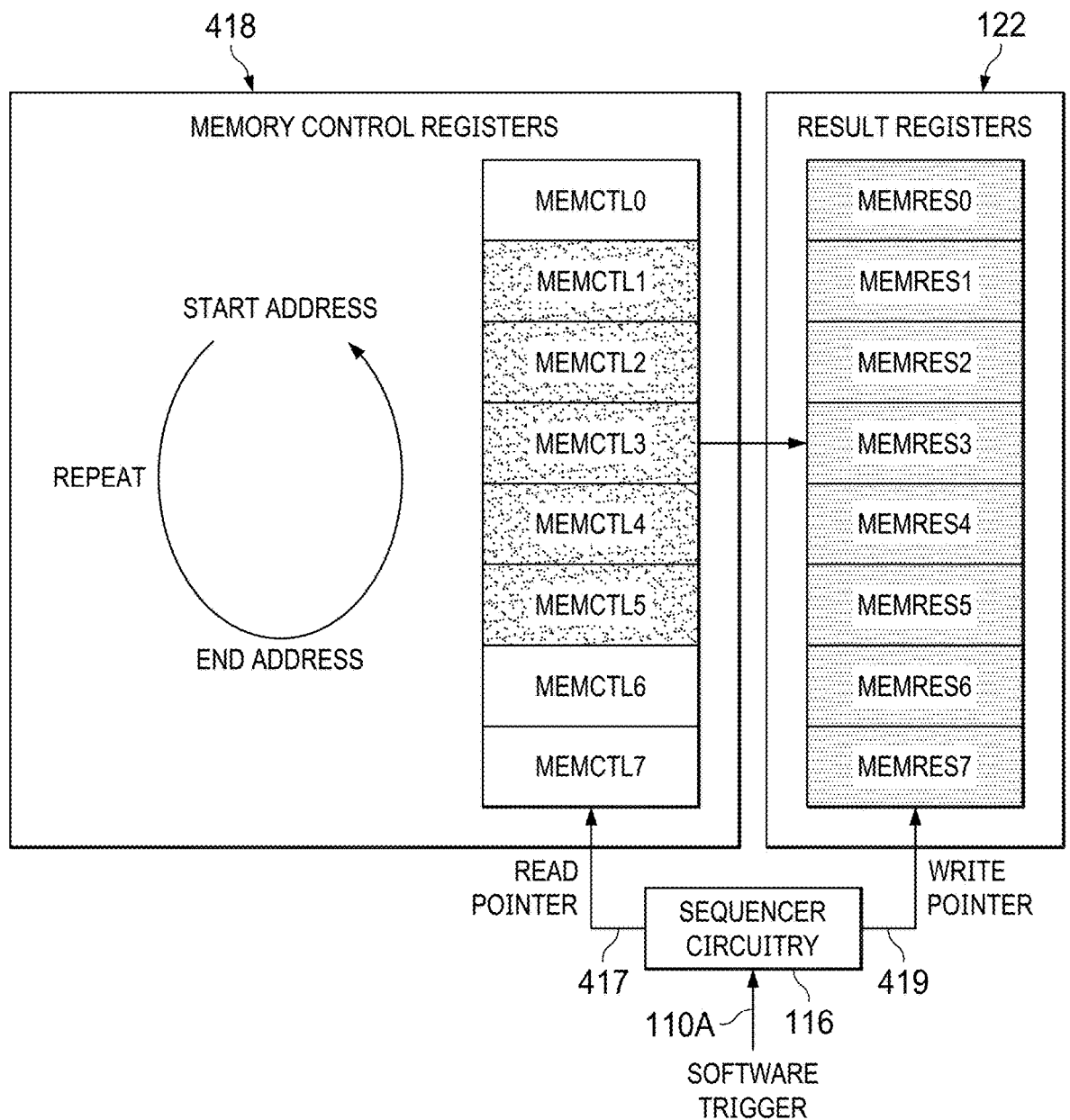
FIG. 8 is an illustrative example of a repeat multiple channels conversion state and a signal processing state.

FIG. 8 is an illustrative example of repeat multiple channel conversion state and a signal processing state. FIG. 8 includes a software trigger 110A, sequencer circuitry 116, read pointer 417, write pointer 419, memory control registers 418, and result registers 122.

The example software trigger 110A of FIG. 8 indicates that an A/D conversion has been requested. In FIG. 8, the software trigger 110A is provided by the example software application 108.

The conversion mode 414 in the illustrative example of FIG. 8 is in the repeat multiple channel state. As described in FIG. 6, when in the repeat multiple channel state, the example sequencer circuitry 116 updates the read pointer 417 after each A/D conversion such that the read pointer 417 loops between a start address and an end address within the memory control registers 418.

The FIFO mode 416 in the illustrative example of FIG. 8 is in the signal processing state. As described in FIG. 7, when in the signal processing state, the example sequencer circuitry 116 updates the write pointer 419 sequentially and causes the interrupt circuitry 124 to generate an interrupt after a pre-determined threshold number of result registers have been filled. The number of memory control registers 418 that are traversed in repeat multiple channels mode may be independent of the pre-determined threshold number of result registers needed to trigger a DMA transfer. For example, in FIG. 8, the read pointer 417 loops between five memory control registers (MEMCTL1-MEMCTL5), but the sequencer circuitry 116 may trigger a DMA transfer after four of the result registers 122 contain digital values.

FIGS. 7 and 8 illustrate how the example configurable ADC circuitry 114 may be configured to move digital values in to and out of the result registers using a FIFO technique that minimizes the total number of DMA transfers. Such a configuration would be beneficial for an example software application 108 that performs signal processing and therefore requests A/D conversion results at a relatively high frequency. Furthermore, FIGS. 7 and 8 illustrate how an example software application 108 that performs signal processing may choose to receive multiple conversion results using a single conversion configuration or using multiple conversion configurations.

While an example manner of implementing the example configurable ADC circuitry 114 of FIG. 1 is illustrated in FIG. 4, one or more of the elements, processes, and/or devices illustrated in FIG. 4 may be combined, divided, re-arranged, omitted, eliminated, and/or implemented in any other way. Further, the example includes example multiplexer circuitry 402, example sample and hold circuitry 118, example A/D conversion circuitry, example clock pre-scaler circuitry 408, example sample control circuitry 410, example sequencer circuitry 116, example memory control registers 418, example result registers 122, example virtual address mapper circuitry 424, example interrupt circuitry 124 and/or, more generally, the example configurable ADC circuitry 114 of FIG. 4, may be implemented by hardware alone or by hardware in combination with software and/or firmware. Thus, for example, any of the example multiplexer circuitry 402, example sample and hold circuitry 118, example A/D conversion circuitry, example clock pre-scaler circuitry 408, example sample control circuitry 410, example sequencer circuitry 116, example memory control registers 418, example result registers 122, example virtual address mapper circuitry 424, example interrupt circuitry 124 and/or, more generally, the example configurable ADC circuitry 114 of FIG. 4, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example configurable ADC circuitry 114 of FIG. 1 may include one or more elements, processes, and/or devices in addition to, or instead of, those illustrated in FIG. 4, and/or may include more than one of any or all of the illustrated elements, processes, and devices.

Figure 9:
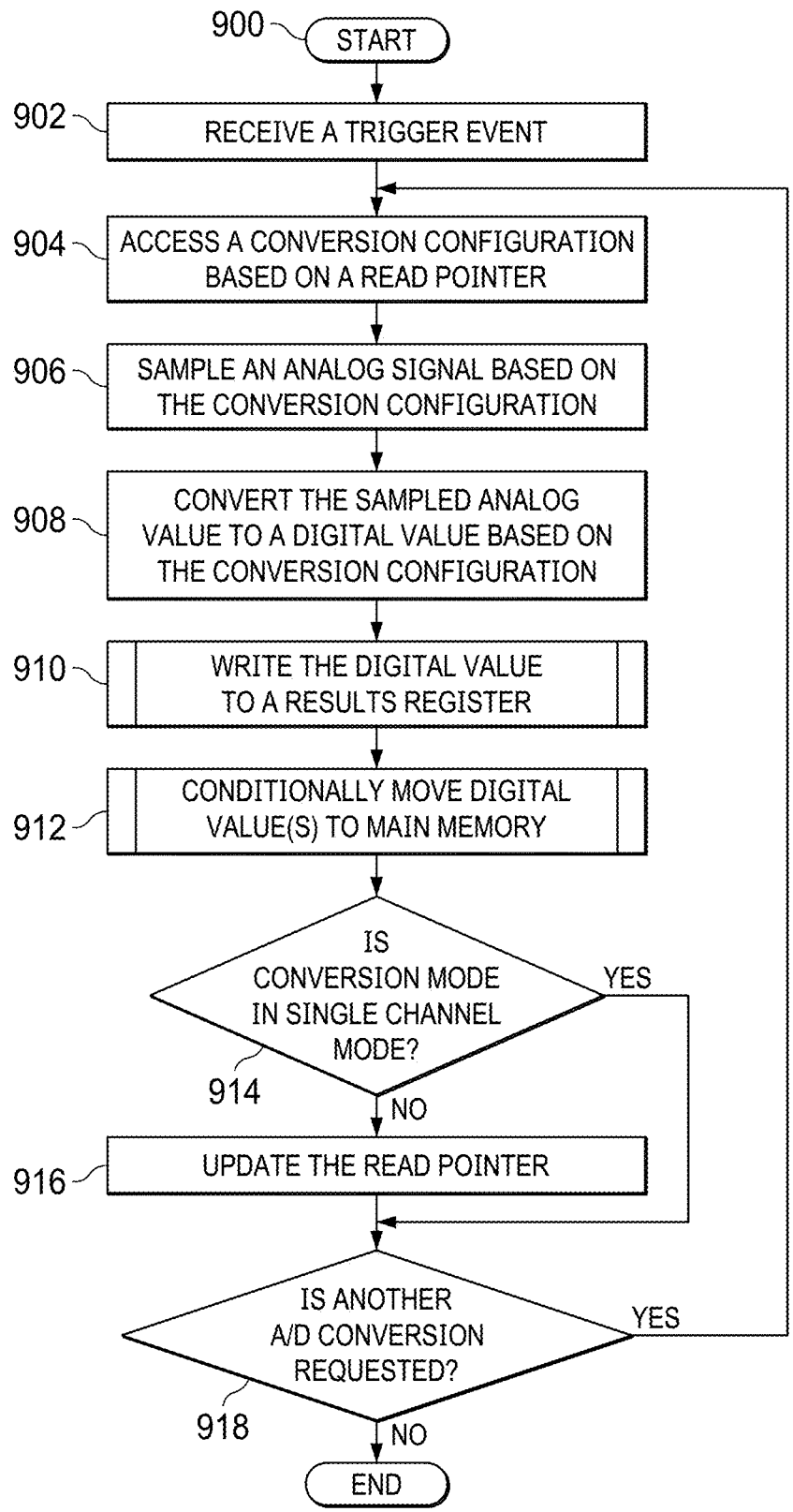
FIG. 9 is a flowchart representative of example machine readable instructions and/or example operations that may be executed by example processor circuitry to implement the configurable ADC circuitry of FIG. 4.
Figure 10:
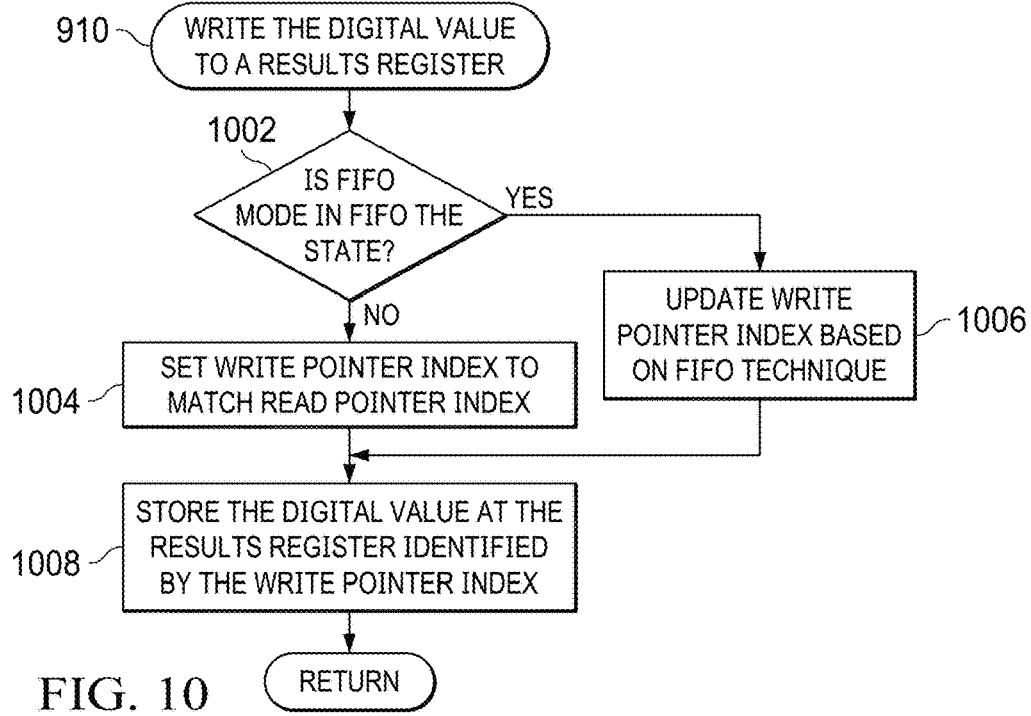
FIG. 10 is a flowchart representative of example machine readable instructions and/or example operations that may be executed by example processor circuitry to write a digital value to a result register as described in FIG. 9.
Figure 11:
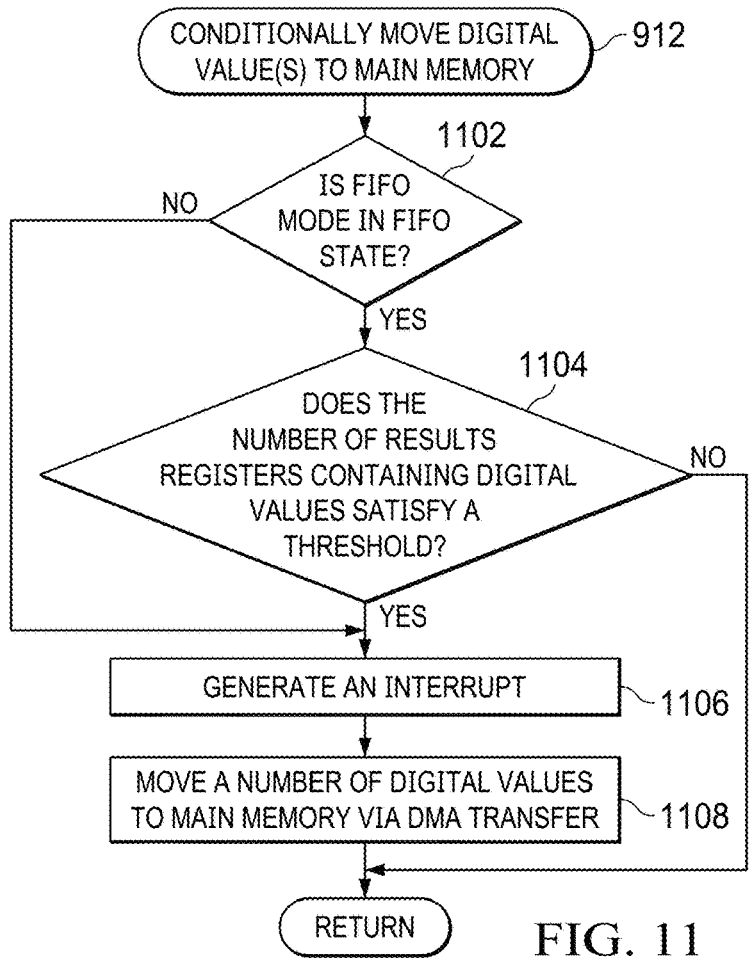
FIG. 11 is a flowchart representative of example machine readable instructions and/or example operations that may be executed by example processor circuitry to conditionally move digital value(s) as described in FIG. 9.

Flowcharts representative of example hardware logic circuitry, machine readable instructions, hardware implemented state machines, and/or any combination thereof for implementing the example configurable ADC circuitry 114 of FIG. 4 are shown in FIGS. 9-11. The machine readable instructions may be one or more executable programs or portion(s) of an executable program for execution by processor circuitry, such as the processor circuitry 1212 shown in the example processor platform 1200 discussed below in connection with FIG. 12. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 9-11, many other methods of implementing the example configurable ADC circuitry 114 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 9-10 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium are expressly defined to include any type of computer readable storage device and/or storage disk and to exclude propagating signals and to exclude transmission media.

FIG. 9 is a flowchart representative of example machine readable instructions and/or example operations 900 that may be executed and/or instantiated by processor circuitry to perform and store one or more A/D conversions. The machine readable instructions and/or the operations 900 of FIG. 9 begin when the example sequencer circuitry 116 receives a trigger event. (Block 902). In FIG. 9, the trigger event is be provided by the example sample control circuitry 410 in response to a software trigger generated by the example software application 108. In other examples, the sample control circuitry 410 may provide a trigger event in response to an event trigger.

The example sequencer circuitry 116 accesses a conversion configuration (Block 904). The example sequencer circuitry 116 uses the read pointer 417 index to access the conversion configuration. The read pointer 417 identifies one of the memory control registers 418, where each register contains a conversion configuration.

The example configurable ADC circuitry 114 samples an analog signal based on the conversion configuration. (Block 906). Specifically, the multiplexer circuitry 402 determines which of the analog signals to select based on the conversion configuration, and the sample and hold circuitry 118 holds the sampled analog voltage for an amount of time based on the conversion configuration.

The example A/D conversion circuitry 120 converts the sampled analog value to a digital value based on the conversion configuration. (Block 908). To determine the digital value, the example A/D conversion circuitry 120 compares the sampled analog voltage to one or more reference voltages provided in the conversion configuration.

The example sequencer circuitry 116 writes the digital value to one of the result registers 122. (Block 910). Block 910 is explored further in FIG. 10.

The example configurable ADC circuitry 114 conditionally moves one or more digital values to main memory 130. (Block 912). Block 912 is explored further in FIG. 11.

The example sequencer circuitry 116 determines whether the conversion configuration should be updated (Block 914). The sequencer circuitry 116 makes the determination of block 914 based on the conversion mode 414. If the conversion mode 414 is in the repeat single channel state, the conversion configuration does not require updating. Conversely, if the conversion mode 414 is in the repeat multiple channel state, the conversion configuration does require updating. The conversion mode 414 is provided to the example sequencer circuitry 116 by the example software application 108.

If the example sequencer circuitry 116 determines the conversion configuration should not be updated, the example machine readable instructions and/or operations 900 proceed to block 918. If the example sequencer circuitry 116 determines the conversion configuration should be updated, the example sequencer circuitry 116 updates the conversion configuration (Block 916). The example sequencer circuitry 116 updates the conversion configuration by updating the read pointer 417 index as described in FIGS. 6 and 8. In doing so, the example sequencer circuitry 116 will access a different conversion configuration whenever the next software trigger 110B is received. The operations of block 916 occur when the conversion mode 414 is in the repeat multiple channels state.

The example sequencer circuitry 116 updates the read pointer 417 sequentially until the read pointer 417 identifies an end address. After the conversion configuration identified by the end address is used to perform an A/D conversion, the sequencer circuitry 116 updates the read pointer 417 to identify a start address. In repeat multiple channels mode, the example software application 108 indicates which of the memory control registers 418 is used as the start address and which of the memory control registers 418 is used as the end address.

The example sequencer circuitry 116 determines whether another A/D conversion is requested. (Block 918). In some examples, a conversion configuration may indicate that the example sequencer circuitry 116 should initiate multiple A/D conversions in response to a single trigger event. In other examples, there is a one to one correspondence between trigger events and A/D conversions. In such examples, the example sequencer circuitry 116 may determine another A/D conversion is requested in response to receiving an additional trigger event.

If the example sequencer circuitry 116 determines that another A/D conversion is requested, the machine readable instructions and/or operations 900 proceed to block 904 where the sequencer circuitry 116 accesses a conversion configuration based on the current value of the read pointer 417. If the example sequencer circuitry 116 determines that another A/D conversion is not requested, the machine readable instructions and/or operations 900 end.

FIG. 10 is a flowchart representative of example machine readable instructions and/or example operations that may be executed by example processor circuitry to write a digital value to a result register as described in FIG. 9. The machine readable instructions and/or operations of block 910 begin when the sequencer circuitry 116 determines whether the FIFO mode 416 is in the signal processing state. (Block 1002). The sequencer circuitry 116 receives the FIFO mode 416 from the example software application 108.

If the FIFO mode 416 is in the sensing and control state (i.e., a 'no' is determined at block 1002), the sequencer circuitry 116 determines the write pointer 419 index to match the read pointer 417 index. (Block 1004). For example, if the read pointer 417 currently identifies MEMCTL3, then the sequencer circuitry 116 sets the write pointer 419 to identify MEMRES3. In some examples, the write pointer 419 may currently identify MEMRES3 before block 910 is executed. In such examples, the sequencer circuitry 116 may verify the write pointer 419 identifies the same index as the read pointer 417.

If the FIFO mode 416 is in the signal processing state, the example sequencer circuitry 116 updates the write pointer 419 based on a FIFO technique. (Block 1006). For example, the example sequencer circuitry 116 may update the write pointer 419 to identify the next register in the result registers 122 that does not currently contain a digital value. In the signal processing state, the write pointer 419 index and read pointer 417 index may identify different numbered registers.

The example sequencer circuitry 116 stores the digital value at the result register corresponding to the write pointer 419 index. (Block 1008). The example machine readable instructions and/or operations 900 return to block 912 after block 1008.

FIG. 11 is a flowchart representative of example machine readable instructions and/or example operations that may be executed by example processor circuitry to conditionally trigger a DMA transfer as described in FIG. 9. The example machine readable instructions and/or operations 900 of block 912 begin when the example sequencer circuitry 116 determines whether the FIFO mode 416 is in the signal processing state. (Block 1102). The example sequencer circuitry 116 receives the FIFO mode 416 from the example software application 108.

If the FIFO mode 416 is in the sensing and control state (i.e., a 'no' is determined at block 1102), the example machine readable instructions and/or operations of block 912 proceed to block 1106. If the FIFO mode 416 is in the signal processing state, the sequencer circuitry 116 determines whether the number of result registers containing digital values satisfies a threshold. (Block 1104). To satisfy the threshold of block 1104, the number of result registers 122 containing digital values may be required to be greater or equal than a pre-determined threshold value. In such examples, the example software application 108 may provide the pre-determined threshold value to the example sequencer circuitry 116.

If the sequencer circuitry 116 determines the number of result registers containing digital values does not satisfy the threshold of block 1104, the example machine readable instructions and/or operations 900 return to block 914. If the sequencer circuitry 116 determines the number of result registers containing digital values does satisfy the threshold of block 1104, the example machine readable instructions and/or operations of block 912 proceed to block 1106.

The example sequencer circuitry 116 notifies the DMA circuitry 128. (Block 1106). The example sequencer circuitry 116 may notify the DMA circuitry 128 causing the interrupt circuitry 124 to generate an interrupt 126A. In response to the notification, the example DMA circuitry 128 moves a number of digital values to main memory 130 via DMA transfer. (Block 1108). The example sequencer circuitry 116 determines the number of digital values to transfer based on the FIFO mode 416. For example, if the FIFO mode 416 is in the sensing and control state, then the sequencer circuitry 116 may instruct the DMA circuitry 128 to transfer a single digital value from the result register identified by the current value of the write pointer 419. However, if the FIFO mode 416 is in the signal processing state, the example sequencer circuitry 116 may instruct the DMA circuitry 128 to transfer a number of digital values equal to the pre-determined threshold value of block 1104. After block 1108, the example machine readable instructions and/or operations 900 return to block 914.

Figure 12:
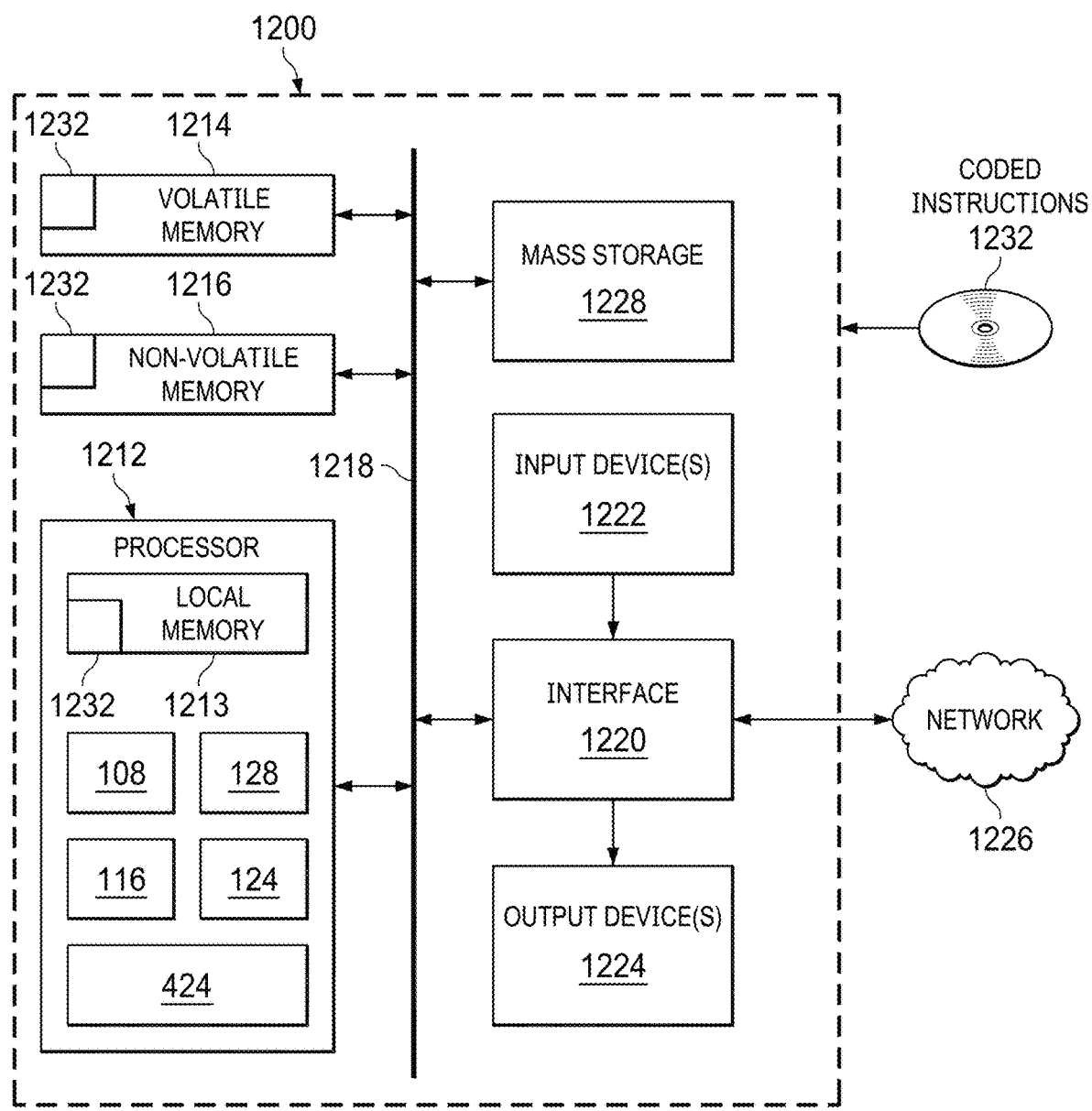
FIG. 12 is a block diagram of an example processing platform including processor circuitry structured to execute the example machine readable instructions and/or the example operations of FIGS. 9-11 to implement the configurable ADC circuitry of FIG. 4.

FIG. 12 is a block diagram of an example processor platform 1200 structured to execute and/or instantiate the machine readable instructions and/or the operations of FIGS. 9-11 to implement the example computer circuitry 100 of FIG. 1. The processor platform 1200 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1200 of the illustrated example includes processor circuitry 1212. The processor circuitry 1212 of the illustrated example is hardware. For example, the processor circuitry 1212 can be implemented by one or more integrated circuits, logic circuits, FPGAs, microprocessors, CPUs, GPUs, DSPs, and/or microcontrollers from any desired family or manufacturer. The processor circuitry 1212 may be implemented by one or more semiconductor based (e.g., silicon based) devices. In this example, the processor circuitry 1212 implements at least the example software application 108, example sequencer circuitry 116, example interrupt circuitry 124, and example virtual address mapper circuitry 424.

The processor circuitry 1212 of the illustrated example includes a local memory 1213 (e.g., a cache, registers, etc.). The processor circuitry 1212 of the illustrated example is in communication with a main memory including a volatile memory 1214 and a non-volatile memory 1216 by a bus 1218. The volatile memory 1214 may be implemented by Synchronous Dynamic Random Access Memory (SDRAM), Dynamic Random Access Memory (DRAM), RAIVIBUS® Dynamic Random Access Memory (RDRAM®), and/or any other type of RAM device. The non-volatile memory 1216 may be implemented by flash memory and/or any other desired type of memory device. Access to the main memory 1214, 1216, 130 of the illustrated example is controlled by a memory controller.

The processor platform 1200 of the illustrated example also includes interface circuitry 1220. The interface circuitry 1220 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1222 are connected to the interface circuitry 1220. The input device(s) 1222 permit(s) a user to enter data and/or commands into the processor circuitry 1212. The input device(s) 1222 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1224 are also connected to the interface circuitry 1220 of the illustrated example. The output device(s) 1224 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1220 of the illustrated example, thus, typically includes a graphics driver card, a graphics driver chip, and/or graphics processor circuitry such as a GPU.

The interface circuitry 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1200 of the illustrated example also includes one or more mass storage devices 1228 to store software and/or data. Examples of such mass storage devices 1228 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 1232, which may be implemented by the machine readable instructions of FIGS. 9-11, may be stored in the mass storage device 1228, in the volatile memory 1214, in the non-volatile memory 1216, and/or on a removable non-transitory computer readable storage medium such as a CD or DVD.

From the foregoing, it will be appreciated that example systems, methods, apparatus, and articles of manufacture have been disclosed that provide a single set of registers that can both provide conversion results as soon as they are generated (as requested by control and sensing applications) and buffer high frequency conversion results (as requested by signal processing applications). Disclosed systems, methods, apparatus, and articles of manufacture improve the efficiency of using a computing device by implementing a conversion mode and a FIFO mode to determine where to store results and when to transfer them to memory. Disclosed systems, methods, apparatus, and articles of manufacture are accordingly directed to one or more improvement(s) in the operation of a machine such as a computer or other electronic and/or mechanical device.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

It is noted that this patent claims priority from Indian Patent Application Number 202141043961, which was filed on Sep. 28, 2021, and is hereby incorporated by reference in its entirety.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus to write data to registers comprising:
   interface circuitry to receive an analog signal; and
   sequencer circuitry to:
   determine whether the apparatus is to operate in a single transfer state or a multiple transfer state;
   access a configuration from a control register in a plurality of control registers;
   initiate a conversion of the analog signal to a digital value based on the configuration; and
   write the digital value to a result register in a plurality of result registers based on the determination.

2. The apparatus of claim 1, wherein the sequencer circuitry is further to:
   determine which control register to access the configuration from based on a read pointer; and
   determine which result register to write the digital value to based on a write pointer.

3. The apparatus of claim 2, wherein:
   the conversion is a first conversion;
   the configuration is a first configuration;
   the control register is a first control register; and
   the sequencer circuitry is to further:
   determine whether a second conversion should produce a digital value based on the first configuration or a second configuration; and
   in response to a determination that the second conversion should produce a digital value based on the second configuration, update the read pointer to identify a second control register in the plurality of control registers.

4. The apparatus of claim 2, wherein the sequencer circuitry is further to, in response to a determination that the apparatus is to operate in the multiple transfer state, update the write pointer to identify a result register with an index that matches a control register identified by the read pointer.

5. The apparatus of claim 2, wherein the plurality of result registers is ordered from a first result register to a last result register, and wherein, in response to a determination that apparatus is to operate in the single transfer state, the sequencer circuitry is further to:
   initially set the write pointer to identify the first result register;
   determine, based on the order and a current result register identified by the write pointer, a next result register that the digital value should be written to; and
   update the write pointer to identify the next result register.

6. The apparatus of claim 5, wherein:
   the sequencer circuitry is to determine the next result register to be the first result register when the current result register identified by the write pointer is the last result register; and
   the sequencer circuitry is to determine the next result register regardless of whether the next result register has an index that matches a control register identified by the read pointer.

7. The apparatus of claim 1, further including:
   Direct Memory Access (DMA) circuitry to transfer one or more digital values from the plurality of result registers to main memory; and
   a software application to access the one or more digital values in main memory.

8. The apparatus of claim 7, wherein:
   the digital value is a first digital value;
   in response to a determination that the apparatus is to operate in the multiple transfer state, the DMA circuitry is to transfer the first digital value to main memory in a first transfer;
   the sequencer circuitry is to further write a second digital value to a result register in the plurality of result registers; and
   in response to a determination that the apparatus is to operate in the multiple transfer state, the DMA circuitry is to transfer the second digital value to main memory in a second transfer.

9. The apparatus of claim 7, wherein:
   the digital value is a first digital value;
   in response to a determination that the apparatus is to operate in a single transfer state:
   the sequencer circuitry is to further determine whether a number of digital values stored in the plurality of result registers satisfies a threshold; and
   in response to a determination that the number of digital values stored in the plurality of result registers satisfies the threshold, the DMA circuitry is to transfer the number of digital values to main memory in a single transfer.

10. The apparatus of claim 7, further including virtual address mapper circuitry to, in response to a determination that the apparatus is to operate in the single transfer state, map the plurality of result registers to a single virtual address to support DMA circuitry that does not implement wrap around addressing.

11. The apparatus of claim 7, wherein:
the sequencer circuitry is to determine whether the apparatus is to operate in the single transfer state or the multiple transfer state based on the software application;
the software application is a first software application;
the apparatus is to operate in the single transfer state for a first amount of time based on the first software application; and
the apparatus is to operate in the multiple transfer state for a second amount of time based on a second software application.

12. At least one non-transitory machine-readable medium comprising instructions that, when executed, cause at least one processor to at least:
receive an analog signal;
determine whether to operate in a single transfer state or a multiple transfer state;
access a configuration from a control register in a plurality of control registers;
initiate a conversion of the analog signal to a digital value based on the configuration; and
write the digital value to a result register in a plurality of result registers based on the determination.

13. The at least one non-transitory machine-readable medium of claim 12, wherein the instructions, when executed, cause the at least one processor to:
determine which control register to access the configuration from based on a read pointer; and
determine which result register to write the digital value to based on a write pointer.

14. The at least one non-transitory machine-readable medium of claim 13, wherein:
the conversion is a first conversion;
the configuration is a first configuration;
the control register is a first control register; and
the instructions, when executed, cause the at least one processor to:
determine whether a second conversion should produce a digital value based on the first configuration or a second configuration; and
in response to a determination that the second conversion should produce a digital value based on the second configuration, update the read pointer to identify a second control register in the plurality of control registers.

15. The at least one non-transitory machine-readable medium of claim 13, wherein the instructions, when executed, cause the at least one processor to:
in response to a determination to operate in the multiple transfer state, update the write pointer to identify a result register with an index that matches a control register identified by the read pointer.

16. The at least one non-transitory machine-readable medium of claim 13, wherein the plurality of result registers is ordered from a first result register to a last result register, and wherein, in response to a determination to operate in the single transfer state, the instructions, when executed, cause the at least one processor to:
initially set the write pointer to identify the first result register;
determine, based on the order and a current result register identified by the write pointer, a next result register that the digital value should be written to; and
update the write pointer to identify the next result register.

17. The at least one non-transitory machine-readable medium of claim 16, wherein the instructions, when executed, cause the at least one processor to:
determine the next result register to be the first result register when the current result register identified by the write pointer is the last result register; and
determine the next result register regardless of whether the next result register has an index that matches a control register identified by the read pointer.

18. The at least one non-transitory machine-readable medium of claim 12, wherein the instructions, when executed, cause the at least one processor to:
operate in the single transfer state for a first amount of time based on the a software application; and
operate in the multiple transfer state for a second amount of time based on a second software application.

19. A method to write data to registers comprising:
receiving an analog signal;
determining whether to operate in a single transfer state or a multiple transfer state;
accessing a configuration from a control register in a plurality of control registers;
initiating a conversion of the analog signal to a digital value based on the configuration; and
writing the digital value to a result register in a plurality of result registers based on the determination.

20. The method of claim 19, further including:
operating in the single transfer state for a first amount of time based on a first software application; and
operating in the multiple transfer state for a second amount of time based on a second software application.

* * * * *